United States Patent
Jung et al.

(10) Patent No.: US 11,271,610 B2
(45) Date of Patent: Mar. 8, 2022

(54) SWITCHING TRANSFORMERS AND ELECTRONIC SYSTEMS INCLUDING THE SAME

(71) Applicant: Samsung Electronics Co., Ltd., Suwon-si (KR)

(72) Inventors: Wonjun Jung, Seoul (KR); Seunghoon Kang, Hwaseong-si (KR); Kiyong Son, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 17/060,743

(22) Filed: Oct. 1, 2020

(65) Prior Publication Data

US 2021/0119671 A1    Apr. 22, 2021

(30) Foreign Application Priority Data

Oct. 18, 2019  (KR) .................. 10-2019-0130187
Jun. 15, 2020  (KR) .................. 10-2020-0072600

(51) Int. Cl.
| | |
|---|---|
| *H03B 5/00* | (2006.01) |
| *H04B 5/00* | (2006.01) |
| *H03F 3/193* | (2006.01) |
| *H02J 50/80* | (2016.01) |
| *H03F 3/24* | (2006.01) |
| *H02J 50/12* | (2016.01) |
| *H04B 1/04* | (2006.01) |

(52) U.S. Cl.
CPC ............ *H04B 5/0037* (2013.01); *H02J 50/12* (2016.02); *H02J 50/80* (2016.02); *H03F 3/193* (2013.01); *H03F 3/245* (2013.01); *H04B 5/0081* (2013.01); *H04B 2001/0408* (2013.01)

(58) Field of Classification Search
CPC .................................................... H04B 5/0037
USPC ........................................................ 307/104
See application file for complete search history.

(56) References Cited

U.S. PATENT DOCUMENTS

| | | | |
|---|---|---|---|
| 8,095,082 | B2 | 1/2012 | Deng et al. |
| 8,897,726 | B2 | 11/2014 | Kim et al. |
| 9,704,641 | B2 | 7/2017 | Park |

(Continued)

FOREIGN PATENT DOCUMENTS

| | | |
|---|---|---|
| KR | 100187970 B1 | 6/1999 |
| KR | 101266955 B1 | 5/2013 |
| KR | 101815768 B1 | 1/2018 |

*Primary Examiner* — Joseph Chang
(74) *Attorney, Agent, or Firm* — Harness, Dickey & Pierce, P.L.C.

(57) ABSTRACT

A switching transformer includes a drive amplifier configured to output an input signal by amplifying a source signal, a primary circuit including a set of primary inductors, a primary switch, and a first primary connecting wire, the set of primary inductors being configured to receive the input signal at a first primary input/output terminal, the primary switch being configured to adjust an inductance of the set of primary inductors based on a first switching operation, and the first primary connecting wire being configured to electrically connect the first primary input/output terminal to an end of the primary switch, and a secondary circuit configured to mutually electrically couple to the first primary connecting wire and at least one primary inductor among the set of primary inductors.

20 Claims, 22 Drawing Sheets

(56) References Cited

U.S. PATENT DOCUMENTS

2018/0115198 A1  4/2018  Chen et al.
2020/0287584 A1* 9/2020  Yoo ..................... H04B 1/0064

* cited by examiner

SWITCHING TRANSFORMERS AND ELECTRONIC SYSTEMS INCLUDING THE SAME

CROSS-REFERENCE TO RELATED APPLICATIONS

This application claims the benefit of Korean Patent Application Nos. 10-2019-0130187, filed on Oct. 18, 2019, and 10-2020-0072600, filed on Jun. 15, 2020, in the Korean Intellectual Property Office, the disclosures of which are incorporated herein in their entirety by reference.

BACKGROUND

An example embodiment relates to a switching transformer, and more particularly, to a switching transformer used in a transmitter and/or a receiver for wireless communication.

Transformers may electromagnetically couple a primary circuit to a secondary circuit with a certain coupling coefficient via a magnetic flux produced by alternating current flowing in a primary coil and a secondary coil.

With the increase in package price, the chip size of a Radio Frequency Integrated Circuit (RFIC) for wireless mobile communication has been increasingly reduced. Another consideration is that RFICs for wireless mobile communication to produce a desired output with low power. Recently, as mobile communication has evolved from third-generation (3G) to Long-Term Evolution (LTE) to fifth-generation (5G), the size of an RFIC chip has increased to maintain high power efficiency even at a signal characteristic having a high Peak-to-Average Power Ratio (PAPR).

RFICs used for wireless communication may include a transformer to support 5G and a plurality of chains (e.g., Radio Frequency (RF) chains) to support different frequencies.

According to the related art, an RFIC may obtain a target bandwidth by controlling the capacitance of a transformer at an output terminal to have a target frequency range. However, such an RFIC may obtain only a limited bandwidth. Moreover, because it is difficult to control the inductance of the transformer, a load size is fixed, thereby decreasing power efficiency.

The inductance or capacitance of a transformer could be decreased to increase a bandwidth, but there is a structural limit in decreasing the capacitance and the parasitic capacitance of a drain of a drive amplifier.

A switch could be provided between inductors of a transformer to decrease the inductance. However, a transmitter has large output power, linearity is important for the transmitter, and it is more difficult to implement a transmitter as processing size decreases. Accordingly, it is hard to provide a switch between inductors in an existing structure. For example, the reliability of a switch may decrease due to the large output power. Moreover, when a transformer of a transmitter includes a switch, a magnetic flux may be lost due to the switch and a coupling coefficient may be decreased.

SUMMARY

An example embodiment provides a switching transformer including a connecting wire having an inter-digit structure to increase a coupling coefficient between a primary circuit and a secondary circuit and an electronic system including the switching transformer.

An example embodiment also provides a switching transformer including a switch having a plurality of transistors connected in series to each other through the source/drain terminal thereof to increase the reliability of the switch and an electronic system including the switching transformer.

An example embodiment also provides a switching transformer capable of matching an impedance between circuits respectively connected to input and output terminals of a drive amplifier and an electronic system including the switching transformer.

According to an example embodiment, there is provided a switching transformer including a drive amplifier configured to output an input signal by amplifying a source signal, a primary circuit including a set of primary inductors, a primary switch, and a first primary connecting wire, the set of primary inductors being configured to receive the input signal at a first primary input/output terminal, the primary switch being configured to adjust an inductance of the set of primary inductors based on a first switching operation, and the first primary connecting wire being configured to electrically connect the first primary input/output terminal to an end of the primary switch, and a secondary circuit configured to mutually electrically couple to the first primary connecting wire and at least one primary inductor among the set of primary inductors.

According to an example embodiment, there is provided an electronic system including a mixer configured to output a source signal based on a frequency conversion, a drive amplifier configured to output an input signal by amplifying the source signal, a drive input circuit including an input capacitor, a set of input inductors, and an input switch and electrically connected to an input terminal of the drive amplifier, the input switch being configured to adjust an inductance of the set of input inductors based on a first switching operation, a primary circuit including a set of primary inductors, a primary switch, and a first primary connecting wire, the set of primary inductors being configured to receive the input signal at a first primary input/output terminal, the primary switch being configured to adjust an inductance of the set of primary inductors based on a second switching operation, and the first primary connecting wire being configured to electrically connect the first primary input/output terminal to an end of the primary switch, and processing circuitry configured to control the first switching operation and the second switching operation.

According to an example embodiment, there is provided an electronic system including a primary circuit including a set of primary inductors, a primary switch, and a primary connecting wire, the set of primary inductors being configured to receive an input signal at a primary input/output terminal, the primary switch being configured to adjust an inductance of the set of primary inductors based on a first switching operation, and the primary connecting wire being configured to electrically connect the primary input/output terminal to an end of the primary switch, a secondary circuit including a set of secondary inductors, a secondary switch, and a secondary connecting wire, the secondary circuit mutually electrically coupled to the primary connecting wire and at least one primary inductor among the set of primary inductors, the set of secondary inductors being configured to output a signal induced from the primary circuit to a secondary input/output terminal electrically connected to a load, the secondary switch being configured to adjust an inductance of the set of secondary inductors based on a second switching operation, and the secondary connecting wire being configured to electrically connect the secondary input/output terminal to an end of the secondary switch, and processing circuitry configured to control at least one selected from the first switching operation and the second switching operation based on at least one selected from a frequency of the input signal and a size of the load.

According to an example embodiment, the processing circuitry is configured to control the first switching operation by controlling the primary switch to be open based on the frequency of the input signal being less than a frequency value, and controlling the primary switch to be closed based on the frequency of the input signal being greater than or equal to the frequency value.

According to an example embodiment, the processing circuitry is configured to control the first switching operation by controlling the primary switch to increase the inductance of the set of primary inductors based on the frequency of the input signal being less than a frequency value, and controlling the primary switch to decrease the inductance of the set of primary inductors based on the frequency of the input signal being greater than or equal to the frequency value.

According to an example embodiment, the primary switch is configured to selectively connect a first primary inductor among the set of primary inductors to a second primary inductor among the set of primary inductors.

According to an example embodiment, an inductance value of the primary connecting wire is substantially equal to an inductance value of the set of primary inductors.

BRIEF DESCRIPTION OF THE DRAWINGS

An example embodiment will be more clearly understood from the following detailed description taken in conjunction with the accompanying drawings in which.

DETAILED DESCRIPTION

Hereinafter, an example embodiment will be described in detail with reference to the accompanying drawings.

Figure 1:
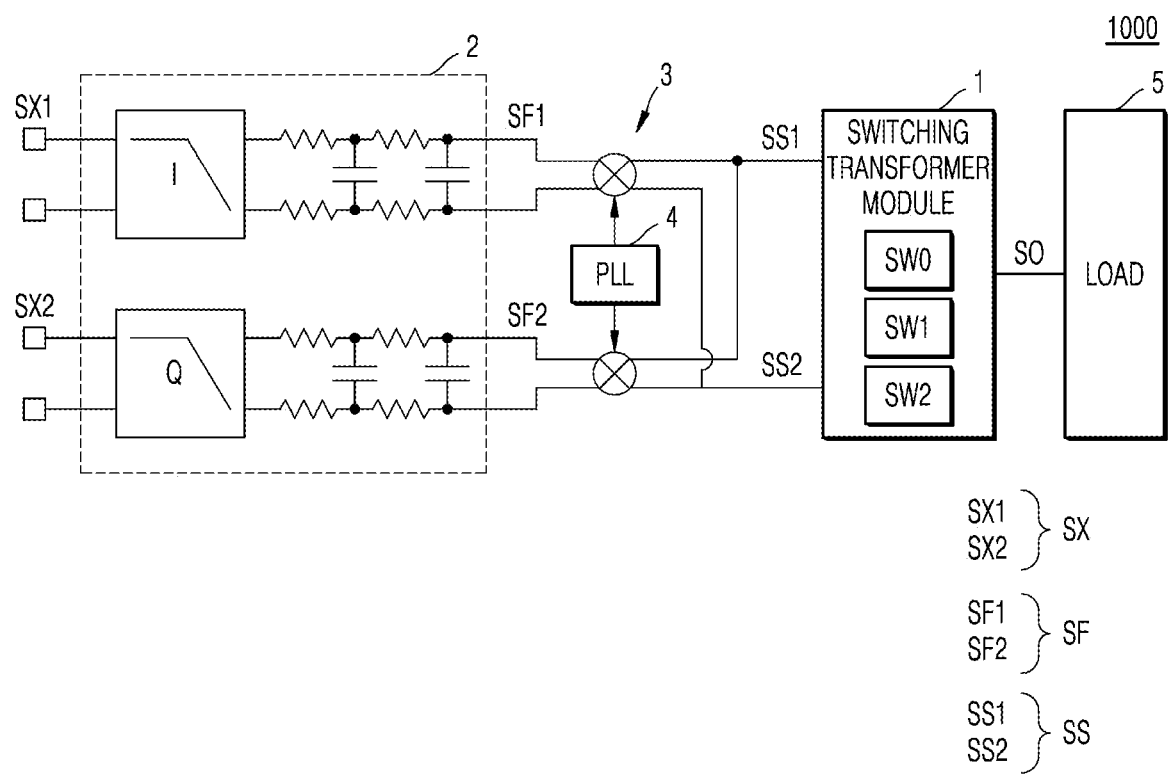
FIG. 1 is a block diagram for describing a radio frequency integrated circuit (RFIC) according to an example embodiment.

FIG. 1 is a block diagram for describing a radio frequency integrated circuit (RFIC) according to an example embodiment.

Referring to FIG. 1, an electronic system 1000 may include a switching transformer module 1, a filter 2, a mixer 3, a Phase-Locked Loop (PLL) 4, and/or a load 5. The switching transformer module 1 may include a plurality of switches, e.g., an input switch SW0, a primary switch SW1, and/or a secondary switch SW2. For example, the electronic system 1000 may correspond to an RFIC, or may be included in a transmitter and/or a receiver of an RFIC. However, for convenience of description, it is illustrated that the electronic system 1000 is included in the transmitter.

According to an example embodiment, the switching transformer module 1 may perform a switching operation based on a received signal. For example, the switching transformer module 1 may adjust an inductance value and/or a capacitance value by controlling at least one selected from the input switch SW0, the primary switch SW1, and/or the secondary switch SW2 based on the frequency of a received signal. The switching transformer module 1 may also perform a switching operation based on a load size. For example, the switching transformer module 1 may adjust an inductance value and/or a capacitance value by controlling at least one selected from the input switch SW0, the primary switch SW1, and/or the secondary switch SW2 based on the impedance value of the load 5.

The electronic system 1000 may receive an external signal SX through an input terminal of the filter 2 to transmit a signal to the load 5. For example, the filter 2 may receive a first external signal SX1 and a second external signal SX2 through differential input terminals. The filter 2 may be a circuit configured to control the amplitude and/or phase of the external signal SX and may include at least one selected from, for example, a low-pass filter, a band-pass filter, and/or a high-pass filter. The filter 2 may output a filtered signal SF by filtering the external signal SX. The filter 2 may output a first filter signal SF1 and a second filter signal SF2 through differential output terminals.

The mixer 3 may frequency convert the filtered signal SF based on a reference signal output from the PLL 4 and output a source signal SS based on the frequency conversion. For example, the mixer 3 may perform up-conversion on the filtered signal SF (e.g., the first filter signal SF1 and the second filter signal SF2) based on the frequency of the reference signal output from the PLL 4. The mixer 3 may output a first source signal SS1 and a second source signal SS2 as a result of the up-conversion.

According to an example embodiment, the switching transformer module 1 may adjust an impedance value by opening or closing the input switch SW0 based on the frequency of the source signal SS. For example, the switching transformer module 1 may adjust the magnitude of input impedance by resonating the input impedance using the frequency of the source signal SS. The input impedance may include impedance observed when viewed from the mixer 3 toward a drive amplifier of the switching transformer module 1. Accordingly, the drive amplifier may smoothly perform amplification or a driving operation. This will be described below with reference to FIG. 2.

According to an example embodiment, the switching transformer module 1 may adjust a mutual inductance of a primary circuit and a secondary circuit by opening or closing at least one selected from the primary switch SW1 and/or the secondary switch SW2 based on the frequency of the source signal SS. For example, the switching transformer module 1 may decrease the inductance of the primary circuit by closing the primary switch SW1, which may be connected in parallel to at least one of a plurality of inductors included in the primary circuit. The secondary switch SW2 may be similar to the primary switch SW1 described above. This will be described with reference to FIG. 4 below.

Figure 2:
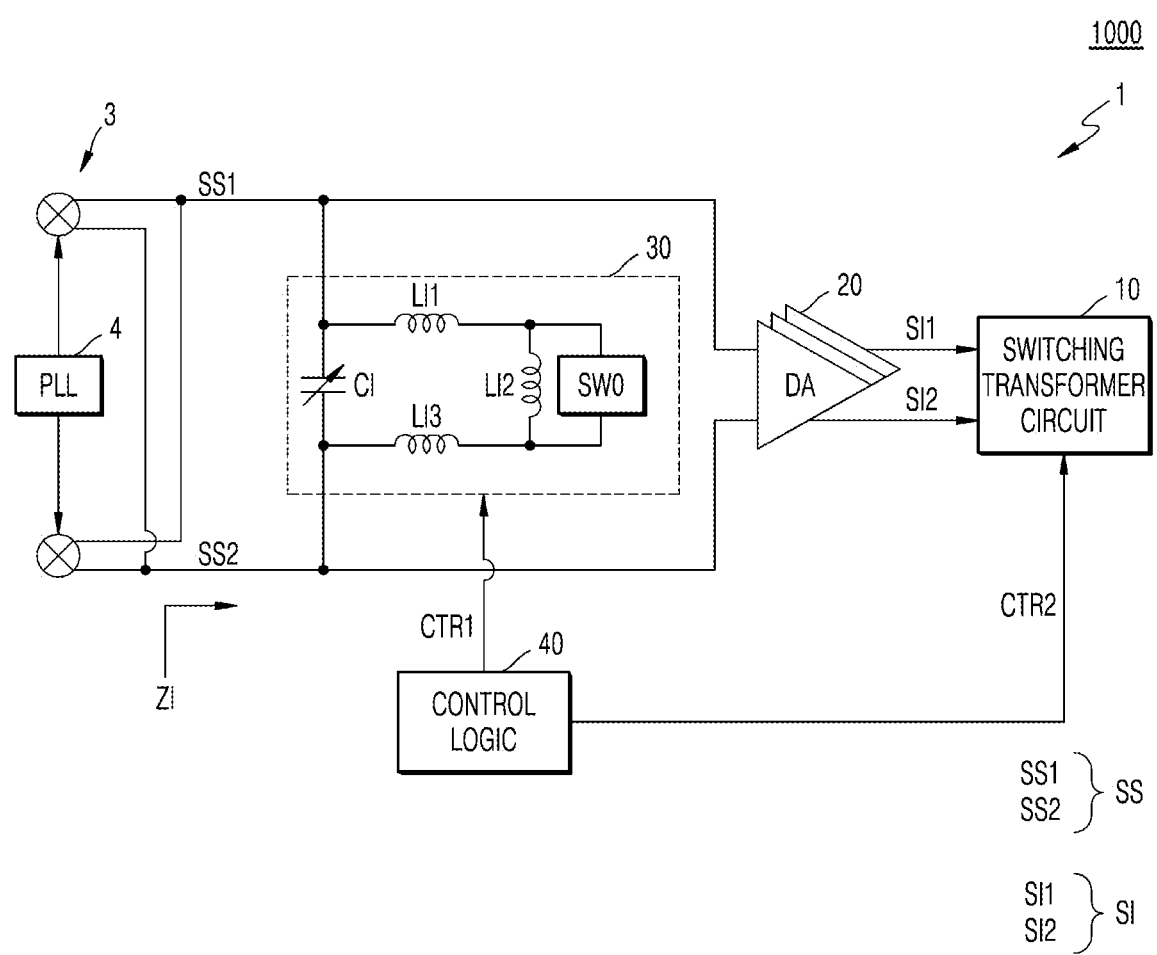
FIG. 2 is a circuit diagram describing a switching transformer module according to an example embodiment.

FIG. 2 is a circuit diagram describing a switching transformer module according to an example embodiment.

Referring to FIG. 2, the switching transformer module 1 may include a switching transformer circuit 10, a drive amplifier (DA) 20, and/or a drive input circuit 30. The drive input circuit 30 may include a plurality of input inductors LI1 through LI3 (may also be referred to herein as the input inductor or the set of input inductors), an input capacitor CI (e.g., a variable capacitor), and/or the input switch SW0. The electronic system 1000 may further include a control logic 40. According to an example embodiment, the control logic 40 may include a storage (e.g., memory) configured to store, e.g., include a look-up table (LUT), information about the frequency of the input signal SI and/or information about the impedance of the load 5.

According to an example embodiment, the drive input circuit 30 may be connected in parallel to input terminals of the DA 20 and may control the input capacitor CI and the input switch SW0 based on a first control command CTR1. The drive input circuit 30 may adjust the capacitance value of the input capacitor CI based on an electrical signal included in the first control command CTR1. The input capacitor CI may be implemented by a capacitor bank including a plurality of capacitor elements. The input switch SW0 may be connected in parallel to at least one, e.g., the input inductor LI2, of the input inductors LI1 through LI3. The input switch SW0 may be opened or closed based on an electrical signal included in the first control command CTR1. In other words, the control logic 40 may transmit the first control command CTR1, which instructs the capacitance value of the input capacitor CI, and opening or closing of the input switch SW0, to the drive input circuit 30. In an example embodiment, the source signal SS (e.g., the first source signal SS1 and the second source signal SS2) may be amplified by the DA 20 to generate an input signal SI (e.g., a first input signal SI1 and a second input signal SI2). The drive input circuit 30 may change an equivalent or similar inductance value of the input inductors LI1 through LI3 by controlling the input switch SW0 and may control impedance viewed from the DA 20 by adjusting the capacitance value of the input capacitor CI connected in parallel to the input inductors LI1 through LI3. Accordingly, the switching transformer circuit 10 may be provided with an appropriate load impedance, and a unit cell of the DA 20 may be turned on according to a fixed load impedance, so that a target output voltage may be generated.

Figure 3A:
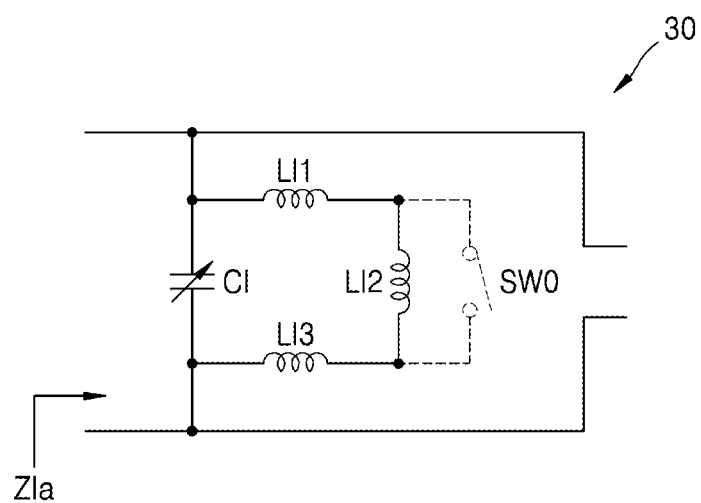
FIGS. 3A and 3B are circuit diagrams for describing a switching operation of an input switch, according to an example embodiment.
Figure 3B:
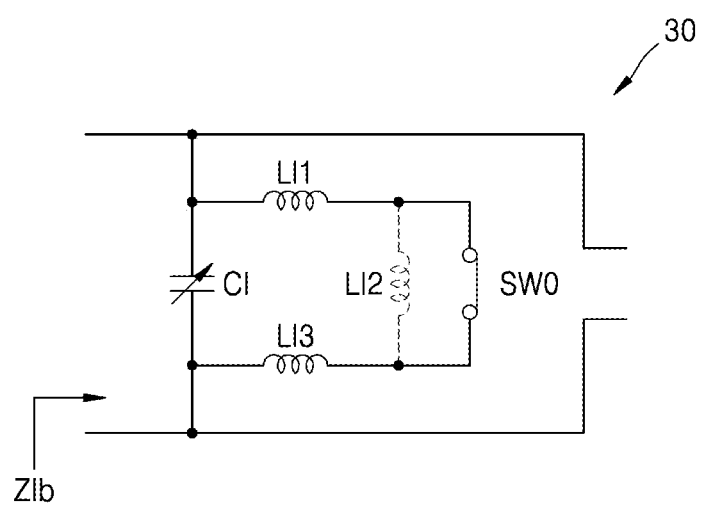

FIGS. 3A and 3B are circuit diagrams for describing a switching operation of an input switch, according to an example embodiment.

Referring to FIGS. 2 through 3B, the control logic 40 may open or close the input switch SW0 and/or adjust the magnitude of input impedance ZIa or ZIb (e.g., the input impedance ZI), according to the frequency of the source signal SS.

The control logic 40 may produce an impedance value, which may minimize or reduce the power consumption of the DA 20, by resonating the input capacitor CI and the input inductors LI1 through LI3, which are connected in parallel to each other. In a scenario in which the drive input circuit 30 includes only the input capacitor CI without the input inductors LI1 through LI3, an impedance value looking at the DA 20 may decrease as the frequency increases. When the impedance value decreases, the magnitude of input current increases, which may increase power consumption. Therefore, when an input impedance value is increased by creating resonance among the input inductors LI1 through LI3 and the input capacitor CI, rapid increases of the input current at a high frequency may be prevented or reduced, thereby reducing power consumption. When an impedance value of the drive input circuit 30, which is connected in parallel to the mixer 3 and the DA 20, increases, the magnitude of the input impedance ZIa may also increase. The DA 20 may output the input signal SI by efficiently driving the source signal SS based on the input impedance ZIa that has increased.

Referring to FIGS. 2 and 3A, when the frequency of the source signal SS is less than a preset or alternatively, given frequency (e.g., a frequency value and/or threshold), the control logic 40 may control the drive input circuit 30 to have a target resonant impedance at a target frequency by opening the input switch SW0. For example, the frequency of the source signal SS may be in an ultra high band (UHB) used for wireless communication and may be in a band from about 3.3 GHz to about 4.6 GHz. When the input switch SW0 is opened, the total inductance of the drive input circuit 30 may be increased by the input inductors LI1 through LI3 connected in series to each other. The frequency of the source signal SS may correspond to a resonant frequency of the drive input circuit 30. Because a resonant frequency is relatively low, the control logic 40 may increase a number of inductors. This is because the resonant frequency is in inverse proportion to an inductance and a capacitance as shown below.

$$\omega_r = \frac{1}{\sqrt{LC}} \qquad \text{[Equation 1]}$$

In Equation 1, $\omega_r$ may be a resonant frequency (e.g., the frequency of the source signal SS), L may be an inductance (e.g., the total inductance of the input inductors LI1 through LI3), and C may be a capacitance (e.g., the capacitance of the input capacitor CI). In other words, the drive input circuit 30 may be controlled to resonate at, or nearer to, the frequency of the source signal SS by increasing the inductance. Adjusting an inductance value by controlling the input switch SW0 may be referred to as coarse tuning.

After increasing the inductance of the drive input circuit 30 by opening the input switch SW0, the control logic 40 may adjust the capacitance of the input capacitor CI. For example, to finely adjust the frequency range of the drive input circuit 30, the control logic 40 may perform fine tuning by adjusting a capacitance. In other words, the control logic 40 may perform coarse tuning by adjusting the inductance to a broad range by opening or closing the input switch SW0 and perform fine tuning by adjusting the capacitance of the input capacitor CI to a narrow range. For example, the coarse tuning may be performed to change the resonant frequency to another band by controlling the inductance in a broad range, and the fine tuning is provided to change the resonant frequency to a target frequency in the band. When many switches are provided among the input inductors LI1 through LI3 connected in series to each other, an equivalent or similar inductance may be finely adjusted. However, the use of many switches would result in increased power consumption. Therefore, a broad frequency range may be firstly adjusted via coarse tuning that controls an inductance, and fine tuning may be then performed to approach a specific frequency range with a variable capacitance.

Referring to FIGS. 2 and 3B, the control logic 40 may close the input switch SW0 when the frequency of the source signal SS is greater than or equal to the preset or alternatively, given frequency (e.g., a frequency value and/or threshold). For example, the frequency of the source signal SS may be in an enhanced License Assisted Access (eLAA) band used for wireless communication and may be in a band from about 4.4 GHz to about 6 GHz. When the input switch SW0 is closed, a current path to the input inductor LI2 is not created, and the total inductance of the drive input circuit 30 may decrease. The control logic 40 may decrease the number of inductors because the resonant frequency is relatively high.

After decreasing the inductance of the drive input circuit 30 by closing the input switch SW0, the control logic 40 may adjust the capacitance of the input capacitor CI. For example, to finely adjust the frequency range of the drive input circuit 30, the control logic 40 may perform fine tuning by adjusting a capacitance.

Referring back to FIG. 2, the control logic 40 may control the input switch SW0 of the drive input circuit 30 to optimize or improve the input impedance ZI according to the frequency of the source signal SS. Accordingly, the DA 20 may cover various frequency values of the source signal SS. The DA 20 may amplify the source signal SS and output the input signal SI, and the switching transformer circuit 10 may perform voltage conversion based on a second control signal CTR2. According to an example embodiment, the control logic 40 may include the look-up table (LUT). The LUT may refer to a mapping table, which stores a predetermined or alternatively, given value of a control signal, e.g., the first and/or second control signal CTR1 and/or CTR2, for each frequency band of an input signal (e.g., the source signal SS). For example, when the frequency of the source signal SS corresponds to an n77 band of 3.7 GHz, the control logic 40 may output a control signal mapped to the n77 band. In another example, when the frequency of the source signal SS corresponds to an n79 band of 4.7 GHz, the control logic 40 may output a control signal mapped to the n79 band. When the frequency corresponds to the n77 band the control signal output should create resonance at a relatively lower frequency than when the frequency corresponds to the n79 band, and may thus include information instructing the opening of the input switch SW0 of the drive input circuit 30.

Figure 4:
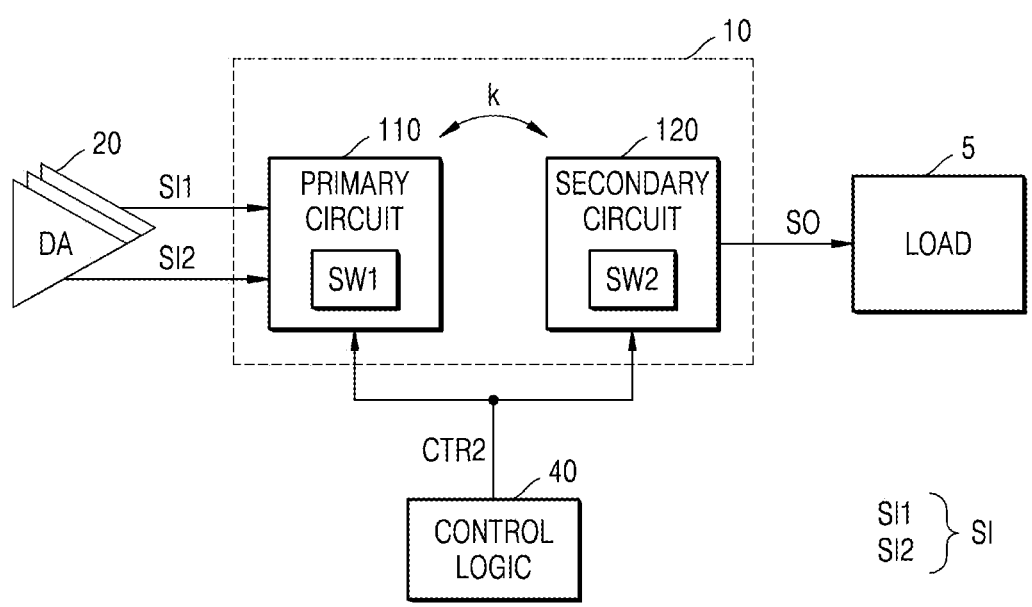
FIG. 4 is a block diagram for describing a switching transformer circuit according to an example embodiment.

FIG. 4 is a block diagram for describing a switching transformer circuit according to an example embodiment.

Referring to FIG. 4, the switching transformer circuit 10 may include a primary circuit 110 and a secondary circuit 120, which are electrically coupled to each other based on a coupling coefficient "k". The primary circuit 110 may include the primary switch SW1, and the secondary circuit 120 may include the secondary switch SW2.

The DA 20 may provide the input signal SI to the primary circuit 110. The primary circuit 110 may produce a magnetic flux based on the input signal SI, and the secondary circuit 120 may generate an output signal SO based on the magnetic flux. In this case, the control logic 40 may provide the second control signal CTR2 to close or open the primary switch SW1 and/or the secondary switch SW2, which may respectively adjust the inductance of the primary circuit 110 and the inductance of the secondary circuit 120.

Figure 5:
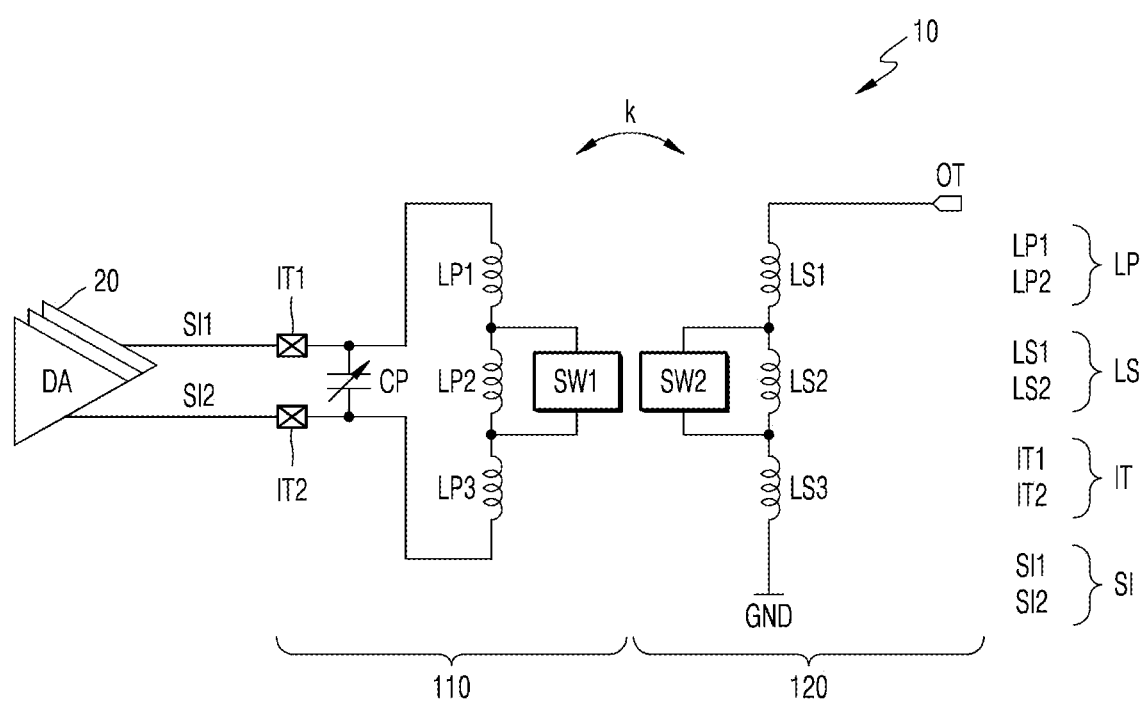
FIG. 5 is a circuit diagram for describing a switching transformer circuit according to an example embodiment.

FIG. 5 is a circuit diagram for describing a switching transformer circuit according to an example embodiment.

Referring to FIG. 5, the primary circuit 110 may include a primary input/output (I/O) terminal IT, a primary capacitor CP, a plurality of primary inductors LP1, LP2, and/or LP3 (the third primary inductor may also be referred to herein as a primary connecting wire LP3), and/or the primary switch SW1. The secondary circuit 120 may include a secondary I/O terminal OT, a plurality of secondary inductors LS1, LS2, and/or LS3 (the third secondary inductor may also be referred to herein as a secondary connecting wire LS3), and/or the secondary switch SW2.

Referring to FIGS. 4 and 5, the primary circuit 110 may include the primary I/O terminal IT, which may include differential input terminals, e.g., a first primary I/O terminal IT1 and a second primary I/O terminal IT2. The input signal SI may include a first input signal SI1 and a second input signal SI2. The primary circuit 110 may receive the first input signal SI1 and the second input signal SI2 through the differential input terminals, e.g., the first primary I/O terminal IT1 and the second primary I/O terminal IT2, respectively. The first input signal SI1 and the second input signal SI2 may respectively correspond to an in-phase (I) signal and a quadrature-phase (Q) signal, which are amplified by the DA 20. The secondary circuit 120 may include the secondary I/O terminal OT, which may be a single output terminal. The output signal SO may include a single-ended signal, and the secondary circuit 120 may output the output signal SO to the load 5 through the secondary I/O terminal OT.

The primary capacitor CP may be connected in parallel to the primary I/O terminal IT. For example, the primary capacitor CP may be connected in parallel to the first primary I/O terminal IT1 and the second primary I/O terminal IT2. The primary capacitor CP may also be connected in parallel to a primary inductor LP. The primary capacitor CP may be a variable capacitor, of which the capacitance is adjusted according to the frequency of the input signal SI when an inductance is adjusted by the switching operation of the primary switch SW1 and/or the secondary switch SW2. For example, the control logic 40 may adjust the capacitance of the primary capacitor CP based on the second control signal CTR2.

Figure 6A:
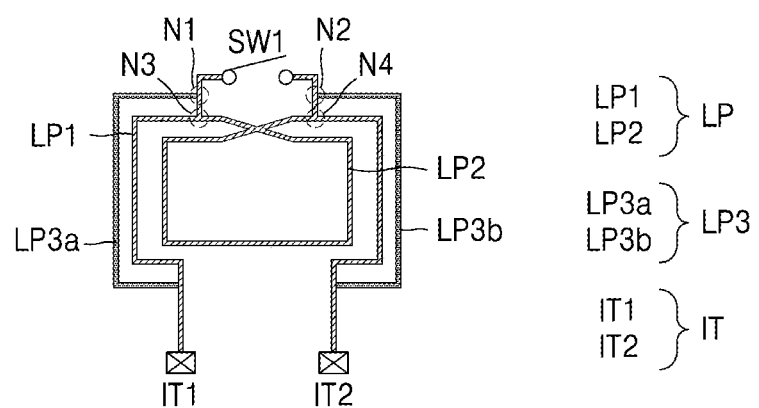
FIGS. 6A and 6B are diagrams for describing a primary circuit according to an example embodiment.
Figure 6B:
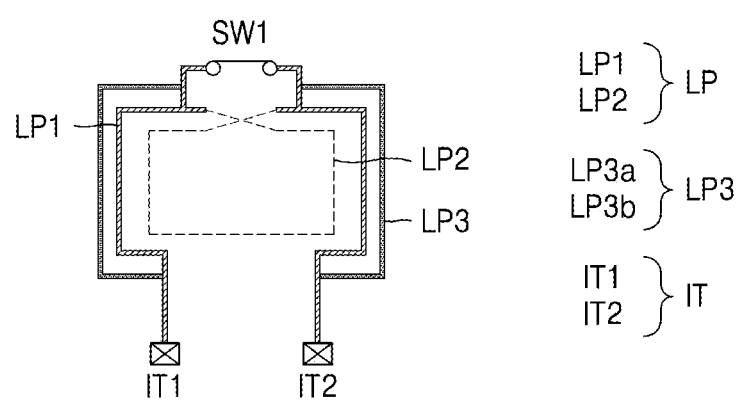

FIGS. 6A and 6B are diagrams for describing a primary circuit according to an example embodiment.

Referring to FIGS. 5 through 6B, a plurality of primary inductors (may also be referred to herein as the primary inductor LP and/or the set of primary inductors) may include a first primary inductor LP1 and the second primary inductor LP2. The primary circuit 110 may include a primary connecting wire LP3.

Referring to FIGS. 6A and 6B, the primary inductor LP may be connected to the primary I/O terminal IT, and the primary I/O terminal IT may receive the input signal SI through differential terminals, e.g., the first primary I/O terminal IT1 and the second primary I/O terminal IT2. In detail, both ends of the primary inductor LP may be electrically connected to the first primary I/O terminal IT1 and the second primary I/O terminal IT2, respectively.

The primary connecting wire LP3 may include a first primary connecting wire LP3$a$ and a second primary connecting wire LP3$b$. The first primary connecting wire LP3$a$ may be electrically connected to the first primary I/O terminal IT1 and an end of the primary switch SW1 through a first node N1, and the second primary connecting wire LP3$b$ may be electrically connected to the second primary I/O terminal IT2 and an opposite end of the primary switch SW1 through a second node N2.

The primary connecting wire LP3 may have an inter-digit structure with respect to the first primary inductor LP1. For example, the primary connecting wire LP3 may extend to be parallel with one side of the first primary inductor LP1 and thus create a magnetic flux in a direction that reinforces a magnetic flux of the first primary inductor LP1. Accordingly, a coupling coefficient between the primary circuit 110 and the secondary circuit 120 may be increased compared to when the primary connecting wire LP3 is not present.

An inductance value of the primary connecting wire LP3 may be equal or substantially equal to an inductance value of the primary inductor LP. In other words, the inductance value of the primary connecting wire LP3 may be equal or substantially equal to the sum of an inductance value of the first primary inductor LP1 and an inductance value of the second primary inductor LP2. A width of the primary connecting wire LP3 may be less than a width of the primary inductor LP. For example, a width of the first primary inductor LP1 may be equal or substantially equal to a width of the second primary inductor LP2, and the width of the primary connecting wire LP3 may be less than the width of each of the first primary inductor LP1 and the second primary inductor LP2. As described above, it was observed through repeated experiments that the coupling coefficient is increased by the inductance value and the width of the primary connecting wire LP3.

The primary connecting wire LP3 and the primary inductor LP may be formed on a first semiconductor layer, and the primary switch SW1 may be formed on a second semiconductor layer stacked on the first semiconductor layer. However, an example embodiment is not limited thereto, and the first semiconductor layer may be stacked on the second semiconductor layer. A first substrate, in which the primary connecting wire LP3 and the primary inductor LP are formed, may be on a different layer than a second substrate, in which the primary switch SW1 is formed. With this, the volume of the primary circuit 110 may be reduced, and the degree of integration of the switching transformer circuit 10 may be increased. The primary connecting wire LP3 and the primary inductor LP may be connected to the primary switch SW1 on a different layer through a conductive via structure filling a via hole. An example embodiment is not limited to the particular structures, materials, and electrical characteristics of the via hole and the conductive via structure.

The primary switch SW1 may perform a switching operation (closing or opening) based on the frequency of the input signal SI. The primary switch SW1 may be connected to a portion of the primary inductor LP, thereby adjusting the total inductance of the primary inductor LP based on the switching operation. The control logic 40 may receive information about the frequency of the input signal SI, which is stored in a storage. Alternatively, the control logic 40 may measure the frequency of the input signal SI and receive information about the measured frequency (e.g., from a frequency sensor). The control logic 40 may transmit the second control signal CTR2 to the primary switch SW1 based on the information about the frequency, thereby closing or opening the primary switch SW1.

Referring to FIG. 6A, the control logic 40 may open the primary switch SW1 when the frequency of the input signal SI is less than a preset or alternatively, given frequency. When the primary switch SW1 is opened, the inductance value of the primary inductor LP may increase. For example, when the primary switch SW1 is opened, induced current may flow in the first primary inductor LP1, the second primary inductor LP2, and the primary connecting wire LP3 but not in the primary switch SW1. Based on the increased inductance value of the primary inductor LP, the primary circuit 110 may resonate according to a relatively low frequency of the input signal SI. In other words, the primary capacitor CP and the primary inductor LP may resonate at the relatively low frequency of the input signal SI. After the primary switch SW1 is opened, the control logic 40 may adjust the capacitance value of the primary capacitor CP to allow the primary circuit 110 to be in a stable resonant state (e.g., such that the primary capacitor CP and the primary circuit 110 mutually resonate). In other words, the control logic 40 may perform fine tuning using the primary capacitor CP.

Referring to FIG. 6B, the control logic 40 may close the primary switch SW1 when the frequency of the input signal SI is greater than or equal to the preset or alternatively, given frequency. When the primary switch SW1 is closed, the inductance value of the primary inductor LP may decrease. For example, when the primary switch SW1 is closed, induced current may flow in the first primary inductor LP1, the primary switch SW1, and the primary connecting wire LP3 but not in the second primary inductor LP2. Based on the decreased inductance value of the primary inductor LP, the primary circuit 110 may resonate according to a relatively high frequency of the input signal SI. In other words, the primary capacitor CP and the primary inductor LP may resonate at the relatively high frequency of the input signal SI. After the primary switch SW1 is closed, the control logic 40 may adjust the capacitance value of the primary capacitor CP to allow the primary circuit 110 to be in a stable resonant state.

Referring to FIGS. 6A and 6B, the primary switch SW1 may be connected in parallel to a portion of the primary inductor LP. In detail, the primary switch SW1 may include switch I/O terminals respectively at both ends of the primary switch SW1 to selectively connect a portion of the primary inductor LP to the other portion of the primary inductor LP. For example, the primary switch SW1 may be connected to the primary connecting wire LP3 through the first node N1 and the second node N2 and may be connected to the first primary inductor LP1 and the second primary inductor LP2 through a third node N3 and a fourth node N4. As described above, each of the first through fourth nodes N1 through N4 may be an electrical node formed by a conductive via structure formed through a via hole.

Figure 7:
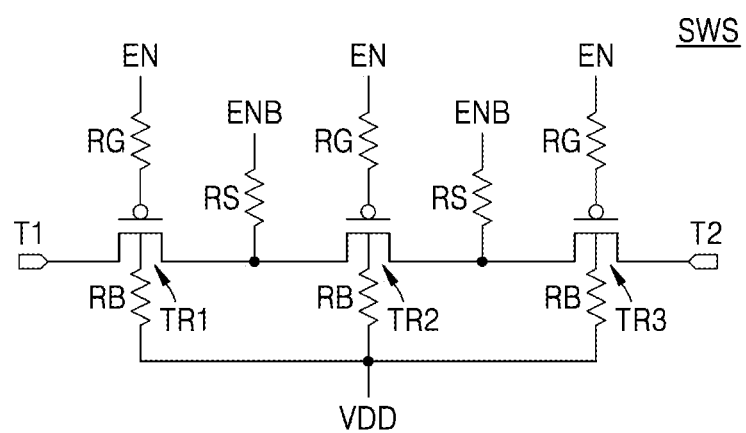
FIG. 7 is a circuit diagram of a stack switch according to an example embodiment.

FIG. 7 is a circuit diagram of a stack switch according to an example embodiment.

Referring to FIG. 7, a stack switch SWS may include a plurality of transistors, e.g., first through third transistors TR1 through TR3, and/or a plurality of resistors RG, RS, and/or RB. At least one selected from the input switch SW0, the primary switch SW1, and/or the secondary switch SW2, which have been described above with reference to the drawings, may be implemented as the stack switch SWS. For example, the primary switch SW1 and/or the secondary switch SW2 may be implemented as the stack switch SWS in order to provide greater reliability with respect to the relatively high power (e.g., high power output by the DA 20) of a transmitter.

An enable signal EN may be applied to a gate terminal of each of the first through third transistors TR1 through TR3, and a drive voltage VDD may be applied to a body terminal thereof. The first through third transistors TR1 through TR3 may be opened or closed in response to the enable signal EN and the drive voltage VDD. The enable signal EN may be included in at least one selected from the first control signal CTR1 and/or the second control signal CTR2.

The first through third transistors TR1 through TR3 may be connected in series to each other through source/drain terminals thereof. For example, when three transistors, e.g., the first through third transistors TR1 through TR3, are connected in series to each other, the stack switch SWS may be referred to as a 3-stack switch. For example, the source terminal of the first transistor TR1 may be connected to the drain terminal of the second transistor TR2, and the source terminal of the second transistor TR2 may be connected to the drain terminal of the third transistor TR3. The drain terminal of the first transistor TR1 may be connected to a terminal T1 of the stack switch SWS, and the source terminal of the third transistor TR3 may be connected to another terminal T2 of the stack switch SWS. The terminals T1 and T2 may be connected to a portion of the primary inductor LP and/or a portion of the secondary inductor LS and/or may be connected in parallel to the input inductor LI2.

Figure 8A:
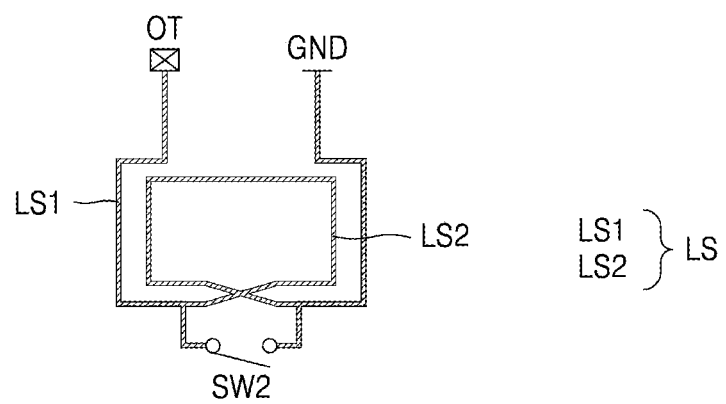
FIGS. 8A and 8B are diagrams for describing a secondary circuit according to an example embodiment.
Figure 8B:
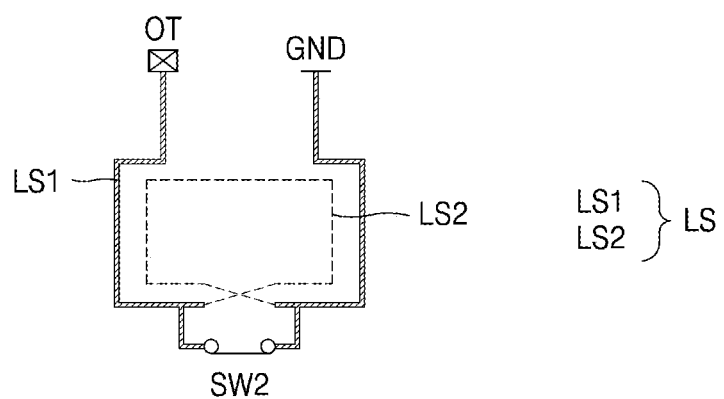
Figure 9A:
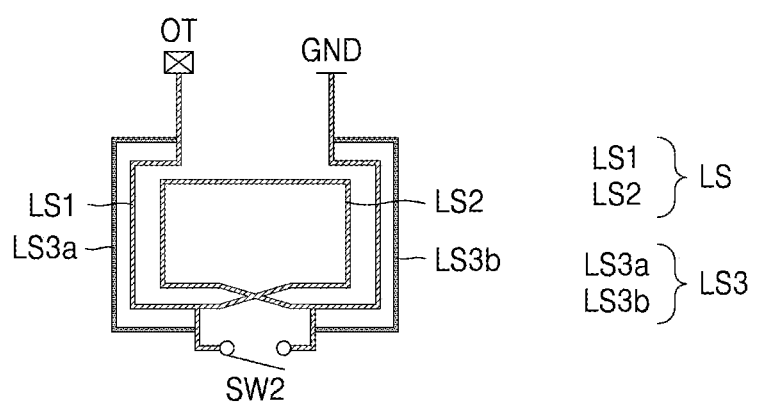
FIGS. 9A and 9B are diagrams for describing a secondary circuit further including a secondary connecting wire compared to FIGS. 8A and 8B.
Figure 9B:
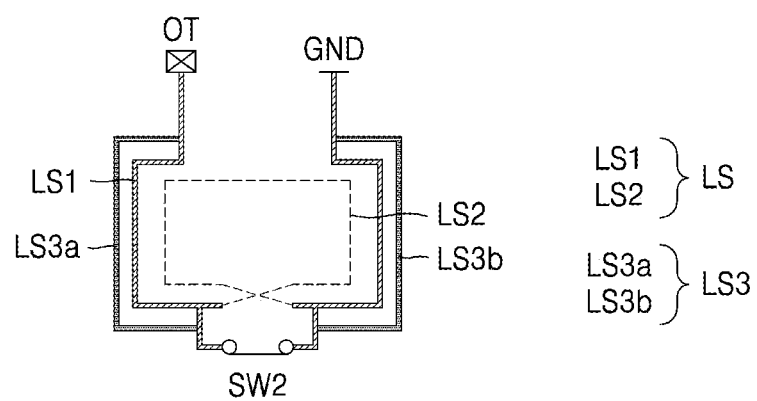

FIGS. 8A and 8B are diagrams for describing a secondary circuit according to an example embodiment, and FIGS. 9A and 9B are diagrams for describing a secondary circuit further including a secondary connecting wire compared to FIGS. 8A and 8B.

Referring to FIGS. 8A and 8B, a secondary inductor LS (may also be referred to herein as the set of secondary inductors) may include a first secondary inductor LS1 and the second secondary inductor LS2. The secondary circuit 120 may include the secondary inductor LS connected to the secondary I/O terminal OT. The secondary switch SW2 may perform a switching operation based on the second control signal CTR2. The secondary switch SW2 may be connected to at least a portion of the secondary inductor LS and may adjust the inductance of the secondary inductor LS based on the switching operation. The secondary inductor LS may output a signal induced from the primary inductor LP to the secondary I/O terminal OT. For example, an end of the secondary inductor LS may be connected to the secondary I/O terminal OT, and an opposite end of the secondary inductor LS may be connected to a ground terminal GND.

Referring to FIGS. 9A and 9B, the secondary circuit 120 may further include the secondary connecting wire LS3, which may include a first secondary connecting wire LS3a and a second secondary connecting wire LS3b. The secondary connecting wire LS3 may extend to be parallel with one side of the first secondary inductor LS1 and thus create a magnetic flux in a direction that reinforces a magnetic flux of the first secondary inductor LS1. The first secondary connecting wire LS3a may be electrically connected to the secondary I/O terminal OT and an end of the secondary switch SW2, and the second secondary connecting wire LS3b may be electrically connected to the ground terminal GND and an opposite end of the secondary switch SW2.

Referring to FIG. 4 and FIGS. 8A through 9B, the inductance of the secondary inductor LS of the secondary circuit 120 may be adjusted based on the switching operation of the secondary switch SW2. The control logic 40 may transmit the second control signal CTR2 to the secondary circuit 120 to adjust the inductance of the secondary inductor LS. The control logic 40 may open the secondary switch SW2 when the impedance of the load 5 is less than a preset or alternatively, given value and/or may close the secondary switch SW2 when the impedance of the load 5 is greater than or equal to the preset or alternatively, given value.

The secondary switch SW2 may be connected in parallel to a portion of the secondary inductor LS. When the secondary switch SW2 is opened, the inductance value of the secondary inductor LS may increase. For example, referring to FIGS. 8A and 9A, induced current may flow in all of the first secondary inductor LS1, the second secondary inductor LS2, and/or the secondary connecting wire LS3. When the secondary switch SW2 is closed, the inductance value of the secondary inductor LS may decrease. For example, referring to FIG. 8B, induced current may flow in the first secondary inductor LS1 but not in the second secondary inductor LS2. Referring to FIG. 9B, induced current may flow in the first secondary inductor LS1 and the secondary connecting wire LS3 but not in the second secondary inductor LS2.

The control logic 40 may receive information about the impedance of the load 5, which is stored in a storage. Alternatively, the control logic 40 may detect the impedance of the load 5 by receiving a signal measuring the impedance of the load 5 (e.g., from an impedance sensor). The detailed structure and characteristics of the secondary circuit 120 are the same as or similar to those of the primary circuit 110 described above and thus omitted.

FIGS. 10A through 11B are diagrams for describing a primary circuit and a secondary circuit, according to an example embodiment.

Figure 10A:
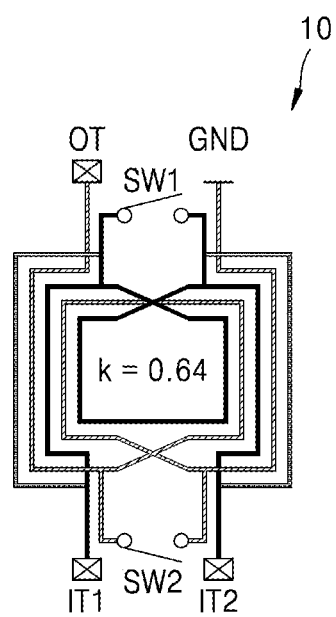
FIGS. 10A through 11B are diagrams for describing a primary circuit and a secondary circuit, according to an example embodiment.
Figure 10B:
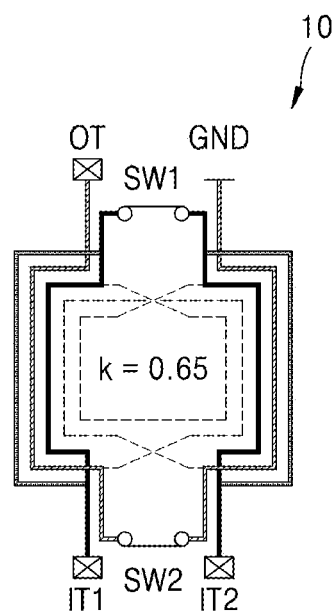

Referring to FIGS. 10A and 10B, the switching transformer circuit 10 may include the primary inductor LP and the primary connecting wire LP3, which have been described with reference to FIGS. 6A and 6B, and the secondary inductor LS described with reference to FIGS. 8A and 8B. In other words, the switching transformer circuit 10 may include the primary inductor LP, the primary connecting wire LP3, and the secondary inductor LS, which are formed on the same semiconductor layer or similar semiconductor layers.

Figure 11A:
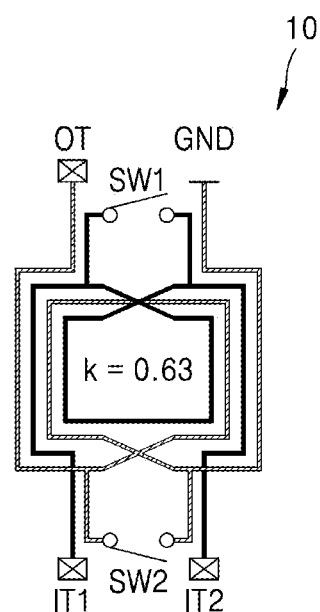
Figure 11B:
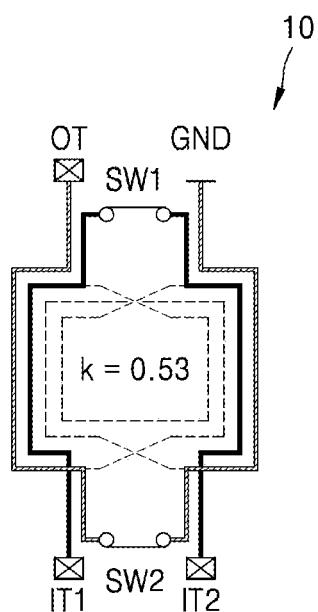

Referring to FIGS. 11A and 11B, the switching transformer circuit 10 may include the primary inductor LP and the secondary inductor LS, which is described with reference to FIGS. 8A and 8B. In other words, the switching transformer circuit 10 may include the primary inductor LP and the secondary inductor LS, which are formed on the same semiconductor layer or similar semiconductor layers.

Referring to FIGS. 10A and 11A, when the frequency of the input signal SI is less than a preset or alternatively, given frequency (e.g., a frequency value and/or frequency threshold), the primary switch SW1 may be opened and the inductance of the primary circuit 110 may increase. When the size of the load 5 is less than a preset or alternatively, given size (e.g., a size value and/or size threshold), the secondary switch SW2 may be opened and the inductance of the secondary circuit 120 may increase. Referring to FIG. 10A, a coupling coefficient (e.g., 0.64) between the primary inductor LP and the secondary inductor LS may increase due to the reinforcement of a magnetic flux by the primary connecting wire LP3 in the switching transformer circuit 10. Referring to FIG. 11A, the coupling coefficient (e.g., 0.63) may decrease in the switching transformer circuit 10 because of the absence of the primary connecting wire LP3.

Referring to FIGS. 10B and 11B, when the frequency of the input signal SI is greater than the preset or alternatively, given frequency (e.g., a frequency value and/or frequency threshold), the primary switch SW1 may be closed and the inductance of the primary circuit 110 may decrease. When the size of the load 5 is greater than or equal to the preset or alternatively, given size (e.g., a size value and/or size threshold), the secondary switch SW2 may be closed and the inductance of the secondary circuit 120 may decrease. Referring to FIG. 10B, the coupling coefficient (e.g., 0.65) between the primary inductor LP and the secondary inductor LS may increase due to the reinforcement of a magnetic flux by the primary connecting wire LP3 in the switching transformer circuit 10. Referring to FIG. 11B, the coupling coefficient (e.g., 0.53) may decrease in the switching transformer circuit 10 because of the absence of the primary connecting wire LP3.

FIGS. 12A through 12D are circuit diagrams of a primary circuit and a secondary circuit in primary and secondary switching operations, according to an example embodiment.

Figure 12A:
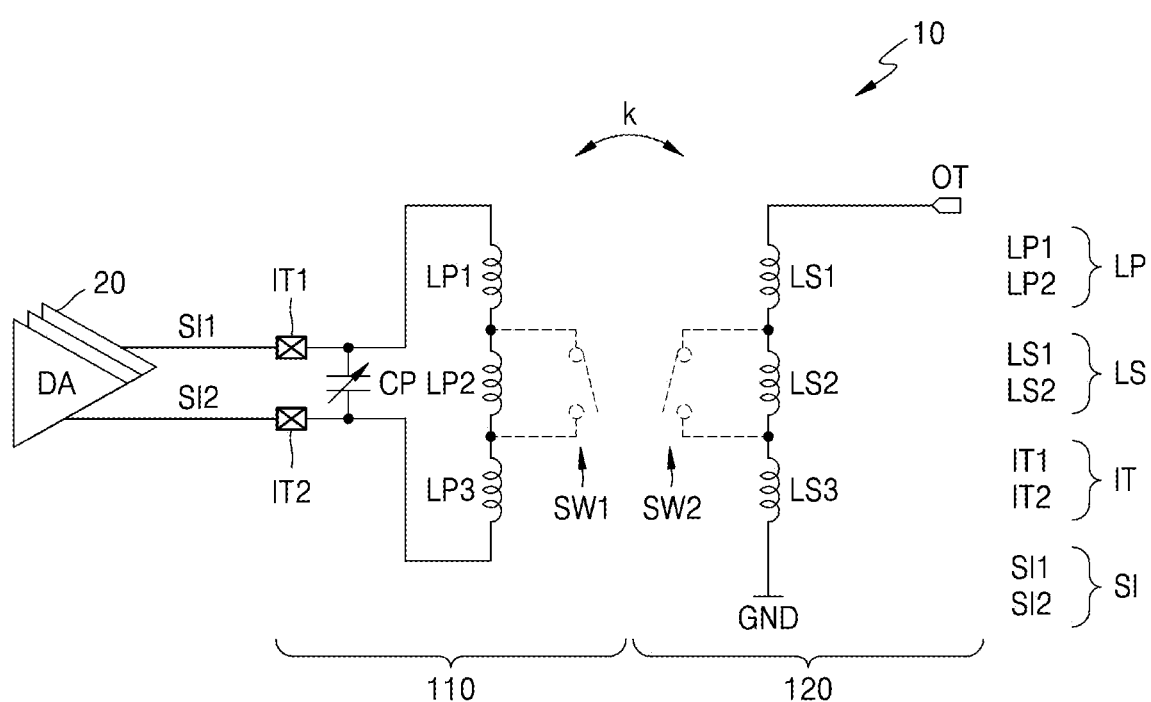
FIGS. 12A through 12D are circuit diagrams of a primary circuit and a secondary circuit in primary and secondary switching operations, according to an example embodiment.

Referring to FIG. 12A, the frequency of the input signal SI may be less than a preset or alternatively, given frequency, and the primary switch SW1 may be opened. When the size of the load 5 is less than a preset or alternatively, given value, the secondary switch SW2 may be opened. In response to the opening of the primary switch SW1, current may not flow in the primary switch SW1 but may flow in the second primary inductor LP2. The inductance value of the primary circuit 110 may be relatively large based on the first primary inductor LP1, the second primary inductor LP2, and the primary connecting wire LP3. In response to the opening of the secondary switch SW2, current may not flow in the secondary switch SW2 but may flow in the second secondary inductor LS2. The inductance value of the secondary circuit 120 may be relatively large based on the first secondary inductor LS1, the second secondary inductor LS2, and the secondary connecting wire LS3.

Figure 12B:
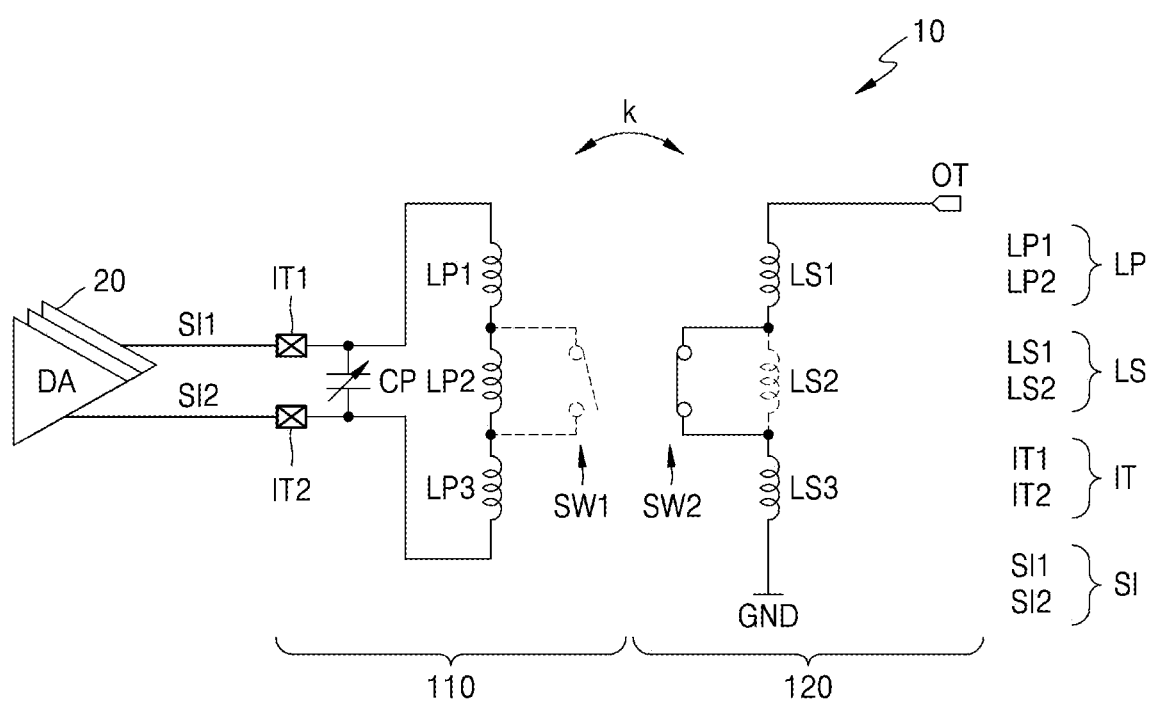

Referring to FIG. 12B, the frequency of the input signal SI may be less than the preset or alternatively, given frequency, and the primary switch SW1 may be opened. As described above, the inductance value of the primary circuit 110 may be relatively large. When the size of the load 5 is greater than or equal to the preset or alternatively, given value, the secondary switch SW2 may be closed. In response to the closing of the secondary switch SW2, current may flow in the secondary switch SW2 but may not flow in the second secondary inductor LS2. The inductance value of the secondary circuit 120 may be relatively small based on the first secondary inductor LS1 and the secondary connecting wire LS3.

Figure 12C:
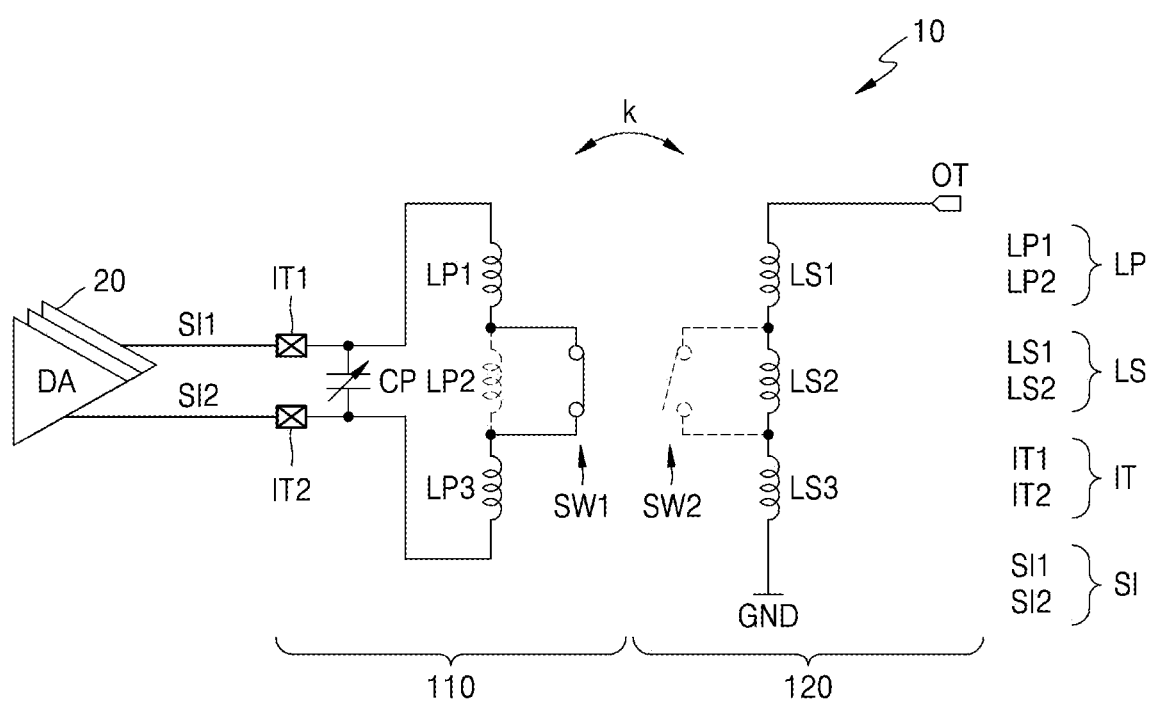

Referring to FIG. 12C, the frequency of the input signal SI may be greater than the preset or alternatively, given frequency, and the primary switch SW1 may be closed. In response to the closing of the primary switch SW1, current may flow in the primary switch SW1 but may not flow in the second primary inductor LP2. The inductance value of the primary circuit 110 may be relatively small based on the first primary inductor LP1 and the primary connecting wire LP3. As described above, when the size of the load 5 is less than the preset or alternatively, given value, the secondary switch SW2 may be opened, and the inductance value of the secondary circuit 120 may be relatively large based on the first secondary inductor LS1, the second secondary inductor LS2, and the secondary connecting wire LS3.

Figure 12D:
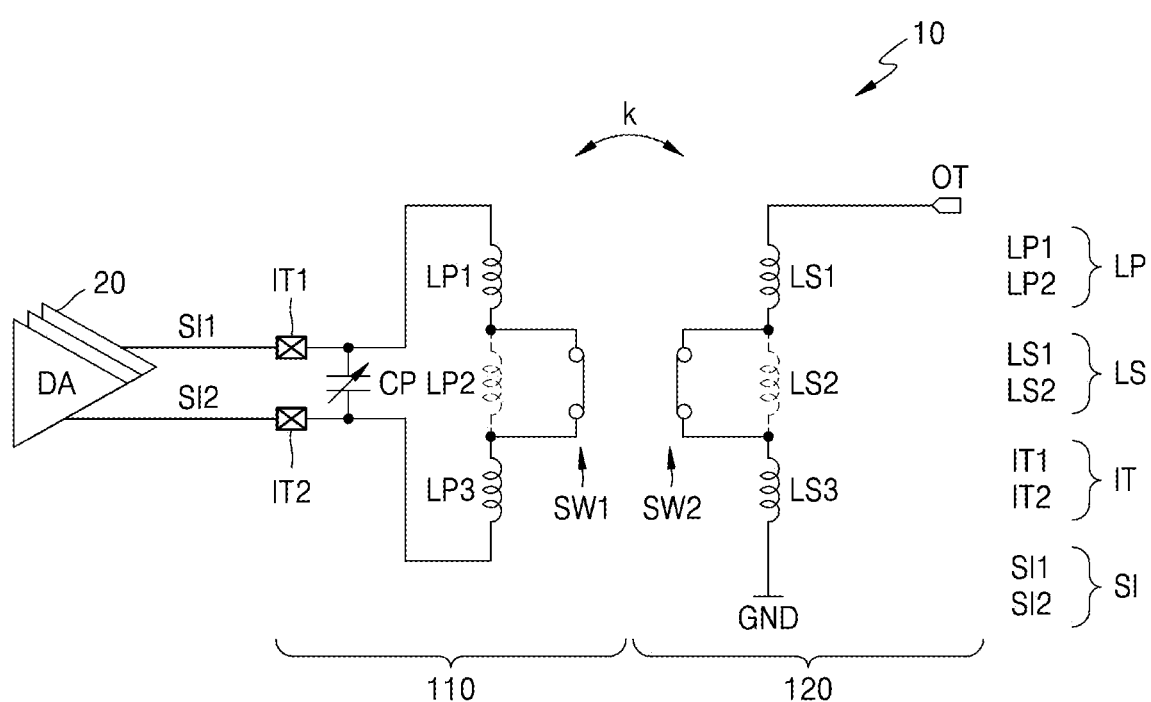

Referring to FIG. 12D, the frequency of the input signal SI may be greater than the preset or alternatively, given frequency, and the size of the load 5 may be greater than the preset or alternatively, given value. In this case, the primary switch SW1 and the secondary switch SW2 are closed, and accordingly, the inductance of each of the primary circuit 110 and the secondary circuit 120 may be relatively small.

Figure 13:
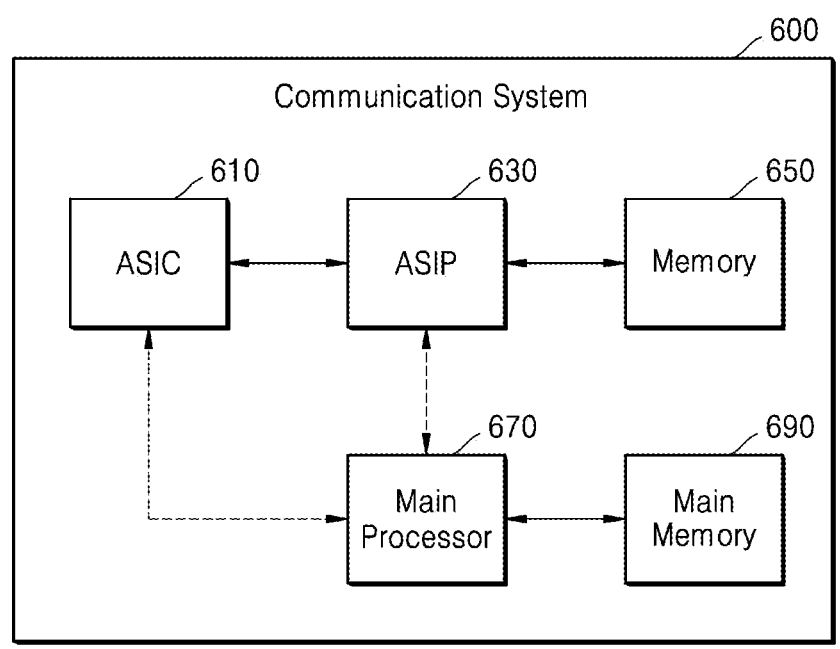
FIG. 13 is a block diagram of a communication device according to an example embodiment.

FIG. 13 is a block diagram of a communication device according to an example embodiment.

Referring to FIG. 13, a communication device 600 may include an application specific integrated circuit (ASIC) 610, an application specific instruction set processor (ASIP) 630, a memory 650, a main processor 670, and/or a main memory 690. At least two selected from the ASIC 610, the ASIP 630, and/or the main processor 670 may communicate with each other. At least two selected from the ASIC 610, the ASIP 630, the memory 650, the main processor 670, and/or the main memory 690 may be embedded in one chip.

The ASIP 630 is customized for a specific purpose and may support an instruction set dedicated to a specific application and execute an instruction included in the instruction set. The memory 650 may communicate with the ASIP 630 and may store a plurality of instructions, as a non-transitory storage device, which may be executed by the ASIP 630. As a non-limiting example, the memory 650 may include any type of memory that is accessible by the ASIP 630, such as random access memory (RAM), read-only memory (ROM), tape, a magnetic disk, an optical disk, volatile memory, non-volatile memory, and a combination thereof.

The main processor 670 may control the communication device 600 by executing instructions. For example, the main processor 670 may control the ASIC 610 and/or the ASIP 630, and may process data received through a wireless communication network or a user input to the communication device 600. The main memory 690 may communicate with the main processor 670 and may store a plurality of instructions, as a non-transitory storage device, which may be executed by the main processor 670. As a non-limiting example, the main memory 690 may include any type of memory, such as RAM, ROM, tape, a magnetic disk, an optical disk, volatile memory, non-volatile memory, and a combination thereof, which is accessible by the main processor 670.

At least one selected from the switching transformer module 1, the switching transformer circuit 10, the drive input circuit 30, and/or the electronic system 1000 may be included in all or some elements of the communication device 600 of FIG. 13. For example, the switching transformer circuit 10 and/or the drive input circuit 30 may be included in an element that uses an output signal resulting from transformation of an input signal and may also be included in an element that uses a transformation ratio controlled according to the frequency of an input signal. An operating method of the switching transformer circuit 10 and/or the drive input circuit 30 may be performed by at least one element of the communication device 600 of FIG. 13. For example, the operation of the control logic 40 in FIG. 2 may be implemented by a plurality of instructions stored in the memory 650, and the ASIP 630 may perform at least one operation in the operating method of the switching transformer circuit 10 and/or the drive input circuit 30 by executing a plurality of instructions stored in the memory 650. In an example embodiment, at least one operation in the operating method of the switching transformer circuit 10 and/or the drive input circuit 30 may be performed by a hardware block designed using logic synthesis, wherein the hardware block may be included in the ASIC 610. In an example embodiment, at least one operation in the operating method of the switching transformer circuit 10 and/or the drive input circuit 30 may be implemented by a plurality of instructions stored in the main memory 690, and the main processor 670 may perform at least one operation in the operating method of the switching transformer circuit 10 and/or the drive input circuit 30 by executing a plurality of instructions stored in the main memory 690.

Conventional transformers include a switch for use in decreasing the inductance of the transformer to increase bandwidth. However, the conventional switches included in the conventional transformers are rendered unreliable by the high output power of the conventional transformers. Also, the switch reduces a magnetic flux in the conventional transformer, resulting in a decreased coupling coefficient.

However, an example embodiment provides an improved transformer. The improved transformer may include an improved switch implemented as a stack switch that provides greater reliability in the high output power environment of the improved transformer. Also, the improved transformer may include primary and/or secondary connecting wires connected in parallel with one side of first primary and/or secondary inductors, thereby creating a magnetic flux that reinforces the magnetic flux of the first primary and/or secondary inductors and increases the coupling coefficient of the improved transformer.

According to an example embodiment, operations described herein as being performed by the electronic system 1000, the switching transformer module 1, the filter 2, the mixer 3, the PLL 4, the input switch SW0, the primary switch SW1, the secondary switch SW2, the switching transformer circuit 10, the drive amplifier (DA) 20, the drive input circuit 30, the control logic 40, the primary circuit 110 and/or the secondary circuit 120 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The various operations of methods described above may be performed by any suitable device capable of performing the operations, such as the processing circuitry discussed above. For example, as discussed above, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with an example embodiment disclosed herein may be embodied directly in hardware, in a software module executed by a processor, or in a combination of the two. If implemented in software, the functions may be stored on or transmitted over as one or more instructions or code on a tangible, non-transitory computer-readable medium (e.g., the memory of the control logic 40). For example, a software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

Spatially relative terms, such as "beneath," "below," "lower," "on," "above," "upper" and the like, may be used herein for ease of description to describe one element or feature's relationship to another element(s) or feature(s) as illustrated in the figures. For example, as used herein, the terms "upper," "higher," "on" and/or "top" may refer to an element or feature further in a particular direction with respect to another element or feature, and the terms "lower" and/or "below" may refer to an element or feature further in a direction opposite the particular direction with respect to another element or feature. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

It will be understood that when an element is referred to as being "connected" or "coupled" to another element, it may be directly connected or coupled to the other element or intervening elements may be present. As used herein the term "and/or" includes any and all combinations of one or more of the associated listed items.

While an example embodiment has been particularly shown and described with reference to examples thereof, it will be understood that various changes in form and details may be made therein without departing from the spirit and scope of the following claims.

What is claimed is:

1. A switching transformer comprising:
   a drive amplifier configured to output an input signal by amplifying a source signal;
   a primary capacitor;
   a primary circuit including a set of primary inductors, a primary switch, and a first primary connecting wire, the set of primary inductors being configured to receive the input signal at a first primary input/output terminal, the primary switch being configured to adjust an inductance of the set of primary inductors based on a first switching operation, the first primary connecting wire being configured to electrically connect the first primary input/output terminal to an end of the primary switch, and the primary capacitor being connected in parallel to the set of primary inductors; and
   a secondary circuit configured to mutually electrically couple to the first primary connecting wire and at least one primary inductor among the set of primary inductors.

2. The switching transformer of claim 1, further comprising:
   processing circuitry configured to control the first switching operation by
      controlling the primary switch to be open based on a frequency of the input signal being less than a frequency value, and
      controlling the primary switch to be closed based on the frequency of the input signal being greater than or equal to the frequency value.

3. The switching transformer of claim 2, wherein the controlling the primary switch to be open causes the inductance of the set of primary inductors to increase, and the controlling the primary switch to be closed causes the inductance of the set of primary inductors to decrease.

4. The switching transformer of claim 2,
   wherein
      the first primary input/output terminal is one of a plurality of primary input/output terminals configured to receive the input signal,
      the primary capacitor is connected in parallel to the plurality of primary input/output terminals, and
      the processing circuitry is configured to control a capacitance of the primary capacitor based on the frequency of the input signal such that the primary capacitor and the primary circuit to mutually resonate.

5. The switching transformer of claim 1, wherein the primary switch is configured to selectively connect a first primary inductor among the set of primary inductors to a second primary inductor among the set of primary inductors.

6. The switching transformer of claim 1, wherein the secondary circuit includes a set of secondary inductors, a secondary switch, and a secondary connecting wire, the set of secondary inductors being configured to output a signal induced from the primary circuit to a secondary input/output terminal, the secondary switch being configured to adjust an inductance of the set of secondary inductors based on a second switching operation, and the secondary connecting wire being configured to electrically connect the secondary input/output terminal to an end of the secondary switch.

7. The switching transformer of claim 1, wherein
the first primary input/output terminal is one of a plurality of differential terminals including the first primary input/output terminal and a second primary input/output terminal, the plurality of differential terminals being configured to receive the input signal;
the first primary connecting wire is one of a plurality of primary connecting wires including the first primary connecting wire and a second primary connecting wire;
two ends of the set of primary inductors are electrically connected to the first primary input/output terminal and the second primary input/output terminal, respectively; and
the second primary connecting wire is configured to electrically connect the second primary input/output terminal and an opposite end of the primary switch.

8. The switching transformer of claim 1, wherein an inductance value of the first primary connecting wire is substantially equal to an inductance value of the set of primary inductors.

9. The switching transformer of claim 1, wherein the set of primary inductors and the first primary connecting wire are formed on a first semiconductor layer, and the primary switch is formed on a second semiconductor layer stacked on the first semiconductor layer.

10. The switching transformer of claim 9, wherein the set of primary inductors and the first primary connecting wire are connected to the primary switch through a conductive via structure filling a via hole.

11. The switching transformer of claim 1, wherein a width of the first primary connecting wire is less than a width of each of the set of primary inductors.

12. The switching transformer of claim 1, wherein the primary switch includes a plurality of transistors connected in series, each respective transistor among the plurality of transistors being connected to another transistor among the plurality of transistors by a source or a drain of the respective transistor, each of the plurality of transistors having a gate terminal configured to receive an enable signal, and each of the plurality of transistors having a body terminal configured to receive a drive voltage.

13. The switching transformer of claim 12, wherein the primary switch includes a 3-stack switch, and the plurality of transistors includes three transistors.

14. An electronic system comprising:
a mixer configured to output a source signal based on a frequency conversion;
a drive amplifier configured to output an input signal by amplifying the source signal;
a drive input circuit including an input capacitor, a set of input inductors, and an input switch and electrically connected to an input terminal of the drive amplifier, the input switch being configured to adjust an inductance of the set of input inductors based on a first switching operation;
a primary circuit including a set of primary inductors, a primary switch, and a first primary connecting wire, the set of primary inductors being configured to receive the input signal at a first primary input/output terminal, the primary switch being configured to adjust an inductance of the set of primary inductors based on a second switching operation, and the first primary connecting wire being configured to electrically connect the first primary input/output terminal to an end of the primary switch; and
processing circuitry configured to control the first switching operation and the second switching operation.

15. The electronic system of claim 14, wherein the processing circuitry is configured to control the first switching operation by:
controlling the primary switch to increase the inductance of the set of input inductors based on a frequency of the source signal being less than a frequency value; and
controlling the primary switch to decrease the inductance of the set of input inductors based on the frequency of the source signal being greater than or equal to the frequency value.

16. The electronic system of claim 14, further comprising:
a secondary circuit including a set of secondary inductors, a secondary switch, and a secondary connecting wire, the set of secondary inductors being configured to output a signal induced from the primary circuit to a secondary input/output terminal, the secondary switch being configured to adjust an inductance of the set of secondary inductors based on a third switching operation, and the secondary connecting wire being configured to electrically connect the secondary input/output terminal to an end of the secondary switch.

17. The electronic system of claim 16, wherein the processing circuitry is configured to control the third switching operation of the secondary switch based on a size of a load connected to the secondary input/output terminal.

18. The electronic system of claim 17, wherein the processing circuitry is configured to control the third switching operation by:
controlling the secondary switch to increase the inductance of the set of secondary inductors based on the size of the load being less than a size value; and
controlling the secondary switch to decrease the inductance of the set of secondary inductors based on the size of the load being greater than or equal to the size value.

19. The electronic system of claim 14, wherein
the first primary input/output terminal is one of a plurality of differential terminals including the first primary input/output terminal and a second primary input/output terminal, the plurality of differential terminals being configured to receive the input signal; and
the first primary connecting wire is one of a plurality of primary connecting wires including the first primary connecting wire and a second primary connecting wire, the second primary connecting wire being configured to electrically connect the second primary input/output terminal to an opposite end of the primary switch.

20. An electronic system comprising:
a primary capacitor;

a primary circuit including a set of primary inductors, a primary switch, and a primary connecting wire, the set of primary inductors being configured to receive an input signal at a primary input/output terminal, the primary switch being configured to adjust an inductance of the set of primary inductors based on a first switching operation, and the primary connecting wire being configured to electrically connect the primary input/output terminal to an end of the primary switch, and the primary capacitor being connected in parallel to the set of primary inductors;

a secondary circuit including a set of secondary inductors, a secondary switch, and a secondary connecting wire, the secondary circuit mutually electrically coupled to the primary connecting wire and at least one primary inductor among the set of primary inductors, the set of secondary inductors being configured to output a signal induced from the primary circuit to a secondary input/output terminal electrically connected to a load, the secondary switch being configured to adjust an inductance of the set of secondary inductors based on a second switching operation, and the secondary connecting wire being configured to electrically connect the secondary input/output terminal to an end of the secondary switch; and processing circuitry configured to control at least one selected from the first switching operation and the second switching operation based on at least one selected from a frequency of the input signal and a size of the load.

* * * * *